United States Patent
Ito et al.

(10) Patent No.: US 9,976,209 B2
(45) Date of Patent: May 22, 2018

(54) SLIDING MEMBER AND METHOD FOR MANUFACTURING THE SAME

(75) Inventors: Hirotaka Ito, Kobe (JP); Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 698 days.

(21) Appl. No.: 13/982,613

(22) PCT Filed: Feb. 9, 2012

(86) PCT No.: PCT/JP2012/053011
§ 371 (c)(1),
(2), (4) Date: Jul. 30, 2013

(87) PCT Pub. No.: WO2012/111530
PCT Pub. Date: Aug. 23, 2012

(65) Prior Publication Data
US 2013/0309522 A1    Nov. 21, 2013

(30) Foreign Application Priority Data

Feb. 15, 2011  (JP) .................................. 2011-029570
Nov. 22, 2011  (JP) .................................. 2011-255270

(51) Int. Cl.
*B21D 39/00* (2006.01)
*C23C 14/02* (2006.01)
(Continued)

(52) U.S. Cl.
CPC ............ *C23C 14/022* (2013.01); *C04B 41/00* (2013.01); *C23C 16/0227* (2013.01);
(Continued)

(58) Field of Classification Search
None
See application file for complete search history.

(56) References Cited

U.S. PATENT DOCUMENTS 2,268,869 A * 1/1942 Given .......................... 384/283
2,431,430 A * 11/1947 Shaw .......................... 384/285
(Continued)

FOREIGN PATENT DOCUMENTS

JP    56-153118    11/1981
JP    57-43019     3/1982
(Continued)

OTHER PUBLICATIONS

International Search Report dated May 1, 2012 in PCT/JP12/053011 Filed Feb. 9, 2012.
(Continued)

*Primary Examiner* — Daniel J Schleis
(74) *Attorney, Agent, or Firm* — Oblon, McClelland, Maier & Neustadt, L.L.P.

(57) ABSTRACT

Provided is a sliding member having slidability and abrasion resistance both at satisfactory levels. This sliding member has a sliding surface including a base and a filling part. The base includes a first material and bears regularly arranged concavities. The filling part includes a second material and is arranged in the sliding surface to fill the concavities. The first material includes one selected from the group consisting of a metallic material, a ceramic material, and a carbonaceous material. The second material includes at least one selected from the group consisting of a metallic material, a ceramic material, and a carbonaceous material. The first and second materials differ from each other in at least one of frictional coefficient and hardness. The base and the filling part are substantially flush with each other in the sliding surface.

7 Claims, 7 Drawing Sheets

(51) Int. Cl.
*C04B 41/00* (2006.01)
*F16C 33/24* (2006.01)
*C23C 16/02* (2006.01)
*F16C 33/04* (2006.01)
*F16C 33/06* (2006.01)
*F16C 33/16* (2006.01)

(52) U.S. Cl.
CPC ............ *F16C 33/043* (2013.01); *F16C 33/06* (2013.01); *F16C 33/16* (2013.01); *F16C 33/24* (2013.01); *F16C 2202/02* (2013.01); *F16C 2202/04* (2013.01); *F16C 2240/44* (2013.01); *Y10T 428/12361* (2015.01); *Y10T 428/12396* (2015.01); *Y10T 428/24331* (2015.01); *Y10T 428/24612* (2015.01)

(56) References Cited

U.S. PATENT DOCUMENTS

| | | | |
|---|---|---|---|
| 3,938,868 A * | 2/1976 | VanWyk | 384/278 |
| 5,462,362 A | 10/1995 | Yuhta et al. | |
| 7,399,122 B2 * | 7/2008 | Fujita et al. | 384/276 |
| 7,431,507 B2 * | 10/2008 | Tsuji et al. | 384/276 |
| 2004/0228554 A1 | 11/2004 | Fujita et al. | |
| 2004/0264820 A1 | 12/2004 | Tsuji et al. | |
| 2009/0186206 A1 | 7/2009 | Ito et al. | |
| 2011/0143976 A1 | 6/2011 | Ito et al. | |

FOREIGN PATENT DOCUMENTS

| | | | |
|---|---|---|---|
| JP | 57-43020 | | 3/1982 |
| JP | 57-43021 | | 3/1982 |
| JP | 59-208219 | | 11/1984 |
| JP | 60 60152 | | 4/1985 |
| JP | 60-60152 U | | 4/1985 |
| JP | 60 135564 | | 7/1985 |
| JP | S60135564 | * | 7/1985 |
| JP | 6-313430 | | 11/1994 |
| JP | 8-4770 | | 1/1996 |
| JP | 11 166539 | | 6/1999 |
| JP | 2003-4043 | | 1/2003 |
| JP | 2004 340248 | | 12/2004 |
| JP | 2005 325961 | | 11/2005 |
| JP | 2008 190696 | | 8/2008 |
| JP | 2008 256052 | | 10/2008 |
| JP | 2009 167512 | | 7/2009 |
| JP | 2010 70848 | | 4/2010 |

OTHER PUBLICATIONS

Decision of Refusal dated Apr. 2, 2013 in Japanese Patent Application No. 2011-255270 (with English translation).
Extended European Search Report dated Nov. 27, 2014 in Patent Application No. 12746602.7.

* cited by examiner

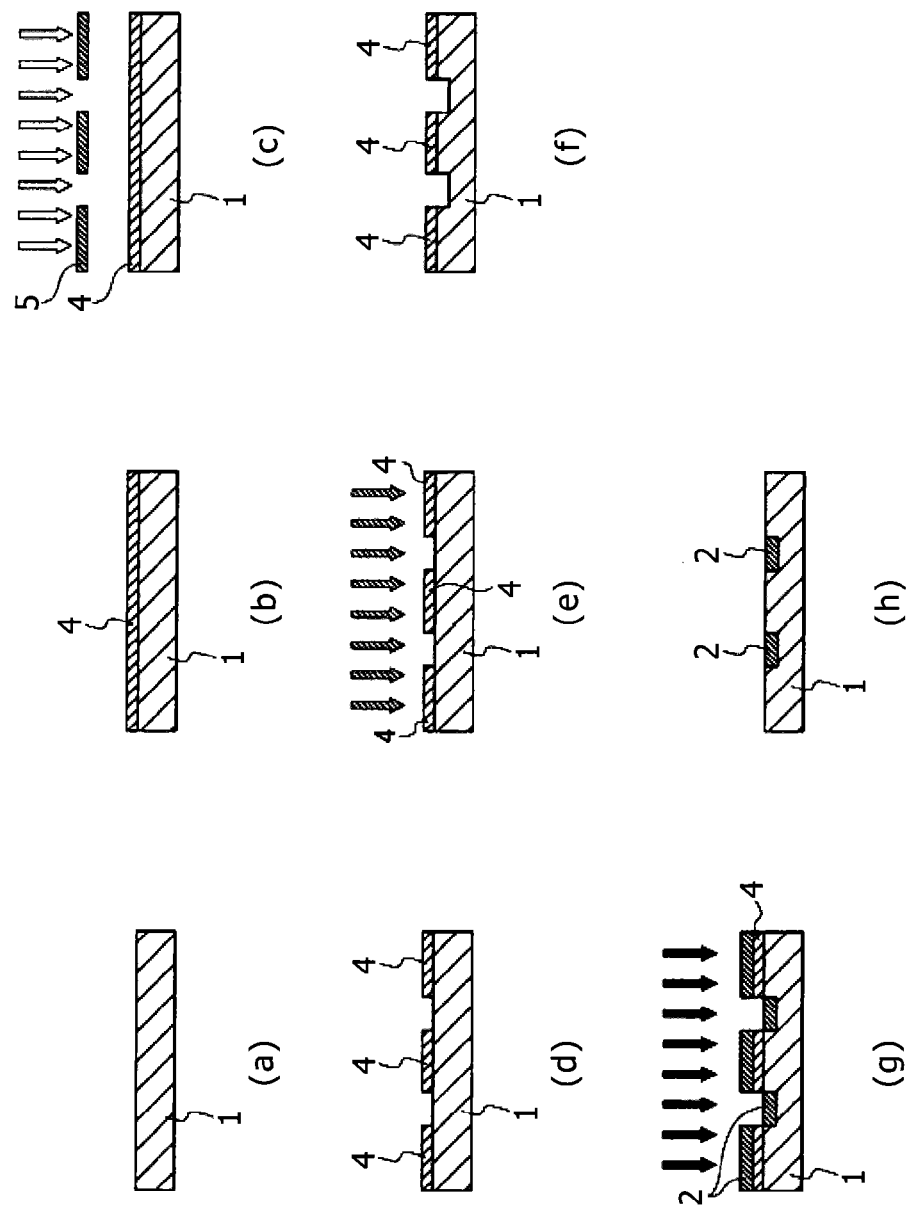

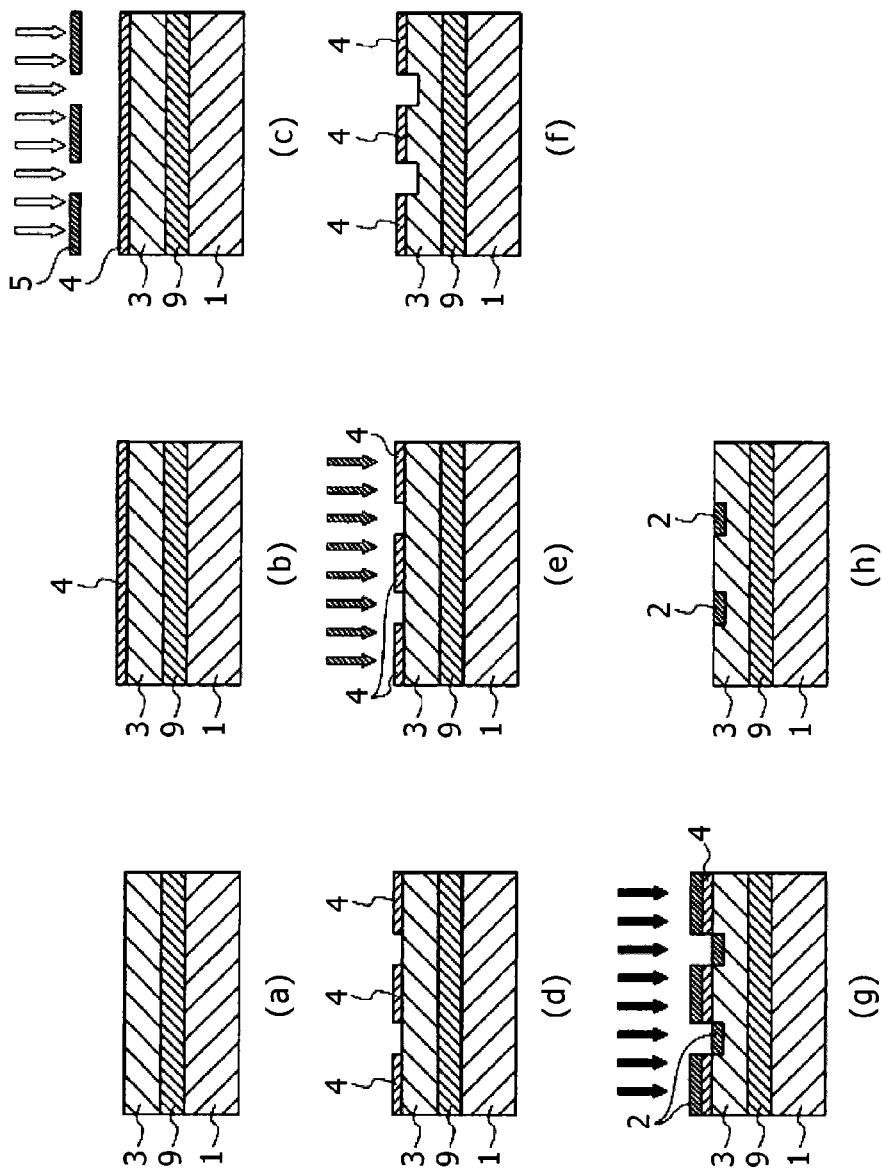

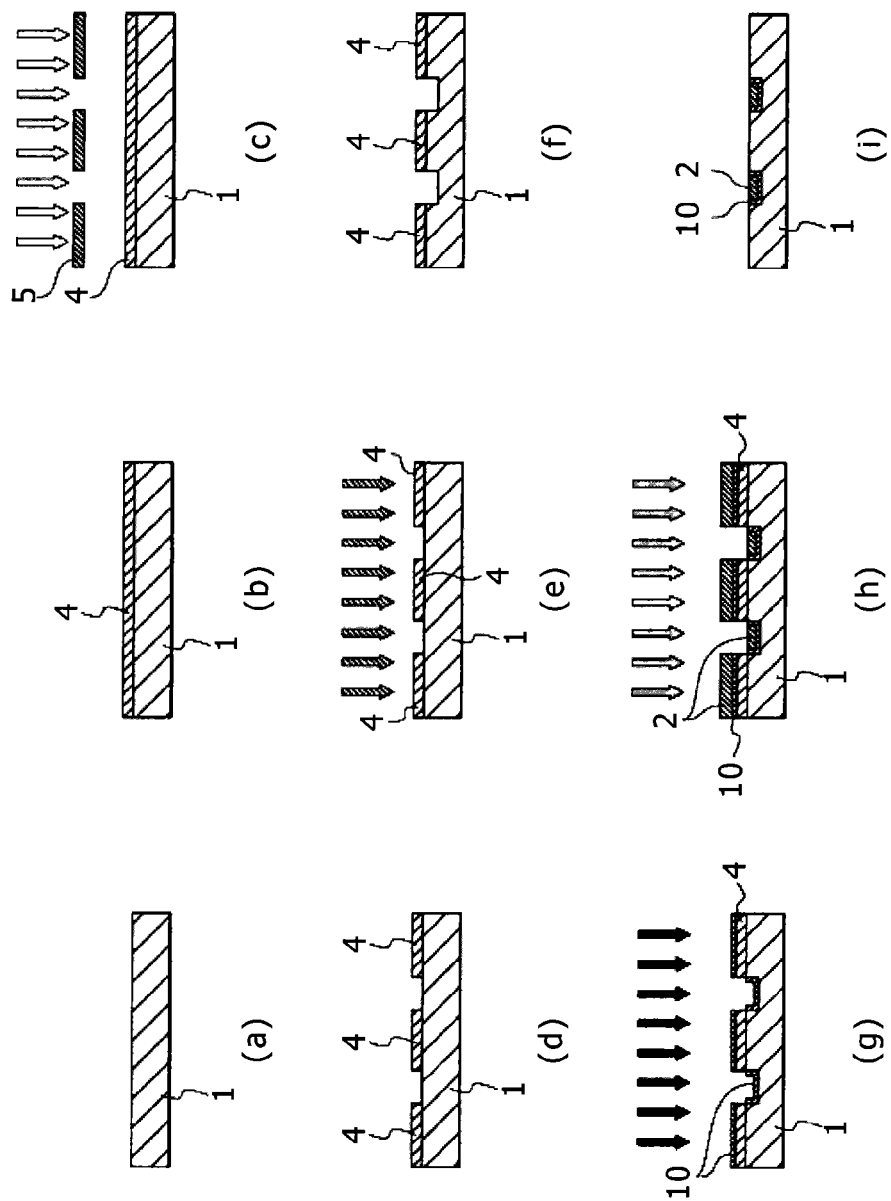

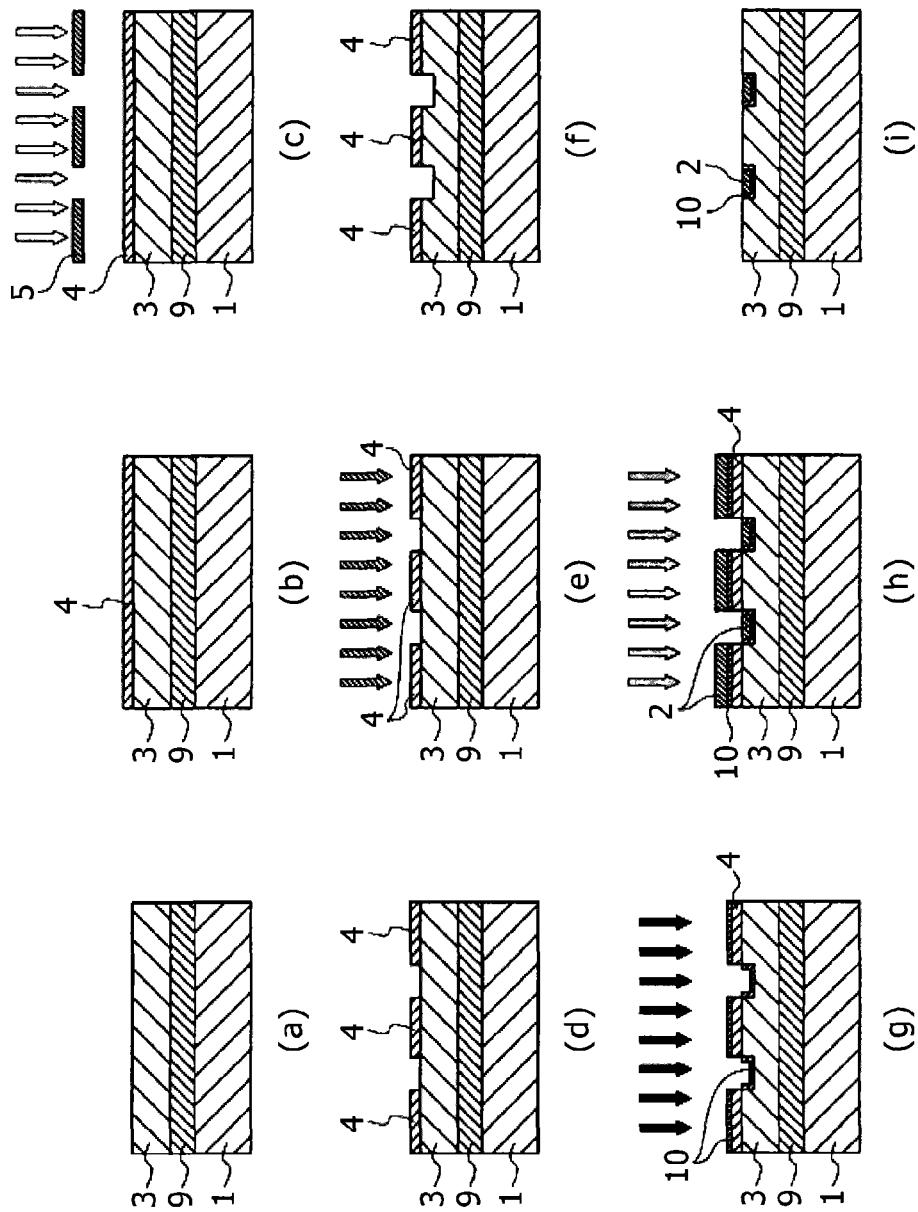

SLIDING MEMBER AND METHOD FOR MANUFACTURING THE SAME

TECHNICAL FIELD

The present invention relates to sliding members and methods for manufacturing the same.

BACKGROUND ART

Sliding members for use typically as automotive engine parts require excellent abrasion resistance and slidability. To impart these properties, coating of a sliding member on its surface with a hard coating such as a diamond-like carbon film (DLC film) has been performed. Typically, Patent Literature (PTL) 1 discloses coating of a sliding member on its sliding surface with a film. This film includes two diamond-like carbon layers differing from each other in hardness, Young's modulus, and thickness. PTL 1 describes that the resulting sliding member exhibits two properties, i.e., durability and low frictional coefficient.

PTL 2 discloses formation of a nitrogen-containing amorphous carbon film on a sliding surface of a sliding member. This film contains hydrogen of from 8.0 to 12.0 atomic percent and nitrogen of from 3.0 to 14.0 atomic percent. PTL 2 describes that the sliding member bearing the film exhibits satisfactory durability even when used under a high surface pressure or in an oil lubrication environment.

CITATION LIST

Patent Literature

PTL 1: Japanese Unexamined Patent Application Publication (JP-A) No. 2009-167512
PTL 2: JP-A No. 2010-070848

SUMMARY OF INVENTION

Technical Problem

The customary techniques consider that a DLC film disadvantageously has poor adhesion to a substrate, and, to solve this disadvantage, attach importance to increase in adhesion in order to increase durability of the sliding member itself. However, demands have been recently made to provide a sliding member having abrasion resistance and slidability both at satisfactory levels.

It is difficult, however, to increase the slidability (frictional property) without impairing the abrasion resistance according to such customary techniques. Demands are now made to provide a sliding member having the two properties at satisfactory levels.

The present invention has been made while focusing on these circumstances, and an object thereof is to provide a sliding member having slidability and abrasion resistance both at satisfactory levels. Another object of the present invention is to provide a method for manufacturing the sliding member.

Solution to Problem

The present invention has achieved the objects and provides, in an embodiment, a sliding member having a sliding surface, the sliding surface including a base; and a filling part, the base including a first material and having concavities regularly arranged in the sliding surface, and the filling part including a second material and arranged in the sliding surface to fill the concavities, in which:

the first material includes one material selected from the group consisting of metallic materials, ceramic materials, and carbonaceous materials;

the second material includes at least one material selected from the group consisting of metallic materials, ceramic materials, and carbonaceous materials;

the first and second materials differ from each other in at least one of frictional coefficient and hardness; and the base and the filling part are substantially flush with each other in the sliding surface. This sliding member is hereinafter also referred to as a "sliding member according to the first embodiment".

The present invention also provides, in another embodiment, a sliding member including a sliding surface, the sliding surface including: a base; a filling part; and an interlayer, the base including a first material and having concavities regularly arranged in the sliding surface, the filling part including a second material and arranged in the sliding surface to fill the concavities, and the interlayer including a third material and lying between the base and the filling part, wherein:

the first material includes one material selected from the group consisting of metallic materials, ceramic materials, and carbonaceous materials;

the second material includes at least one material selected from the group consisting of metallic materials, ceramic materials, and carbonaceous materials;

the third material includes at least one material selected from the group consisting of metallic materials, ceramic materials, and carbonaceous materials;

the first and second materials differ from each other in at least one of frictional coefficient and hardness;

the third material has high affinity with at least one of the first and second materials; and the base, the filling part, and the interlayer are substantially flush with one another in the sliding surface. This sliding member and a sliding member in still another embodiment as follows each have an interlayer. Such a sliding member having an interlayer is hereinafter also referred to as a "sliding member according to the second embodiment".

The present invention further provides, in still another embodiment, a sliding member including a sliding surface, the sliding surface including: a base; a filling part; and an interlayer, the base including a first material and having concavities regularly arranged in the sliding surface, the filling part including a second material and arranged in the sliding surface to fill the concavities, and the interlayer including a third material and lying between the base and the filling part, wherein;

the first material includes one material selected from the group consisting of metallic materials, ceramic materials, and carbonaceous materials;

the second material includes at least one material selected from the group consisting of metallic materials, ceramic materials, and carbonaceous materials;

the third material includes at least one material selected from the group consisting of metallic materials, ceramic materials, and carbonaceous materials;

the first and second materials differ from each other in at least one of frictional coefficient and hardness;

the third material differs from at least one of the first and second materials in at least one of frictional coefficient and hardness;

the base, the filling part, and the interlayer are substantially flush with one another in the sliding surface.

The base may for example be a substrate or a hard coating.

An area percentage of the filling part in the sliding surface is preferably from 0.05% to 55%.

In a preferred embodiment, the concavities include holes; and each of the holes has an opening area of from 0.52 μm² to 4 mm².

In another preferred embodiment, the concavities include trenches; and each of the trenches has a width of from 0.8 μm to 2 mm.

The concavities preferably have a maximum depth of from 0.05 μm to 5.0 μm.

The present invention relates to a method for manufacturing a sliding member according to the first embodiment. This method includes the steps of:

covering a part of a base with a mask to give a partially masked base, the base having no concavities;

etching the partially masked base to give an etched base;

depositing a film of the second material on the etched base through vapor deposition to form a filling part;

removing the mask from the base to give a work including the base and the filling part; and polishing the work so that the base and the filling part are substantially flush with each other to form a sliding surface.

The present invention further relates to a method for manufacturing a sliding member according to the second embodiment. This method includes the steps of:

covering a part of a base with a mask to give a partially masked base, the base having no concavities;

etching the partially masked base to give an etched base;

depositing a film of the third material on the etched base through vapor deposition to form an interlayer;

depositing a film of the second material on the interlayer through vapor deposition to form a filling part;

removing the mask from the base to give a work including the base, the filling part, and the interlayer; and polishing the work so that the base, the filling part, and the interlayer are substantially flush with one another to form a sliding surface.

The etching is preferably performed by ion bombardment.

The base may for example be a substrate or a hard coating.

In a preferred embodiment, the mask includes masking regions and exposing regions; and the masking regions and the exposing regions are regularly arranged.

Advantageous Effects of Invention

The present invention can provide sliding members which are usable even in a severe sliding environment or a sliding environment in the absence of a lubricant, because the invention allows the sliding members to have slidability and abrasion resistance both at satisfactory levels.

BRIEF DESCRIPTION OF DRAWINGS

FIGS. 6(a) to 6(h) depict a process chart schematically illustrating a method for manufacturing a sliding member according to the first embodiment, where the base is a substrate.

FIGS. 7(a) to 7(h) depict a process chart schematically illustrating a method for manufacturing a sliding member according to the first embodiment, where the base is a hard coating.

FIGS. 8(a) to 8(i) depict a process chart schematically illustrating a method for manufacturing a sliding member according to the second embodiment, where the base is a substrate.

FIGS. 9(a) to 9(i) depict a process chart schematically illustrating a method for manufacturing a sliding member according to the second embodiment, where the base is a hard coating.

DESCRIPTION OF EMBODIMENTS

After intensive investigations to achieve the objects, the present inventors formed concavities in a base constituting a sliding surface of a sliding member and filled the concavities with a material differing from that of the base in frictional coefficient and/or hardness. The present inventors found that the sliding member having this configuration can have higher abrasion resistance and slidability than those of a sliding member having a base including a single material and can serve as a sliding member having slidability and abrasion resistance both at satisfactory levels. The present invention has been made based on these findings.

Sliding members according to embodiments of the present invention will be illustrated in detail below.

Sliding members according to the first and second embodiments of the present invention each include a sliding surface. The sliding surface has a base and a filling part, where the base includes a first material and has concavities regularly arranged in the sliding surface; and the filling part includes a second material and is arranged in the sliding surface to fill the concavities. The sliding members according to the first and second embodiments include in common a first material constituting the base and a second material constituting the filling part, in which the first and second materials differ from each other in at least one of frictional coefficient and hardness.

When used as a material constituting the filling part, a material having a frictional coefficient different from that of the base enables the control of lubricity which the base inherently has; whereas a material having a hardness different from that of the base contributes to better abrasion resistance. Typically, a sliding member may employ, as a material constituting the filling part, a material having a lower frictional coefficient and a higher hardness than those of a material constituting the base. This sliding member can have both a higher abrasion resistance and a lower frictional coefficient than those of a sliding member having a sliding surface including the material constituting the base alone.

Structures of sliding members according to embodiments of the present invention will be illustrated below.

The sliding member according to the first embodiment of the present invention has a sliding surface. The sliding surface includes a base and a filling part, where the base includes a first material and bears concavities regularly arranged in the sliding surface; and the filling part includes a second material and is arranged in the sliding surface to fill the concavities. The base is exemplified by a substrate and a hard coating.

Figure 1:
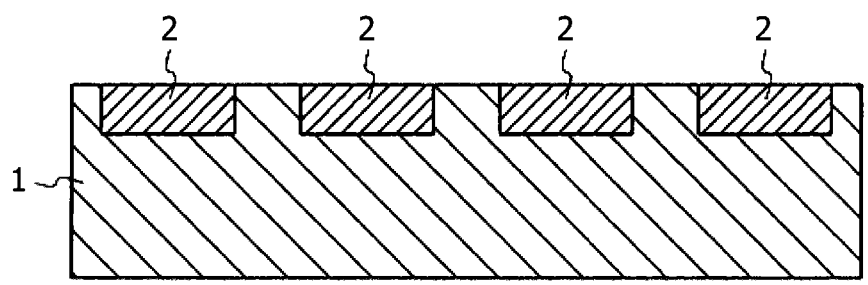
FIG. 1 depicts a schematic cross-sectional view illustrating a cross section of a sliding member according to the first embodiment, where the base is a substrate.

FIG. 1 illustrates a schematic cross-sectional view of an exemplary sliding member according to the first embodiment, where the base is a substrate. With reference to FIG. 1, the sliding member has a structure as follows. Concavities are provided on a substrate 1, into which a second material is charged to form a filling part 2. The second material differs from the substrate 1 in at least one of frictional coefficient and hardness. The substrate 1 and the filling part 2 define a sliding surface and are substantially flush with each other in the sliding surface.

Figure 2:
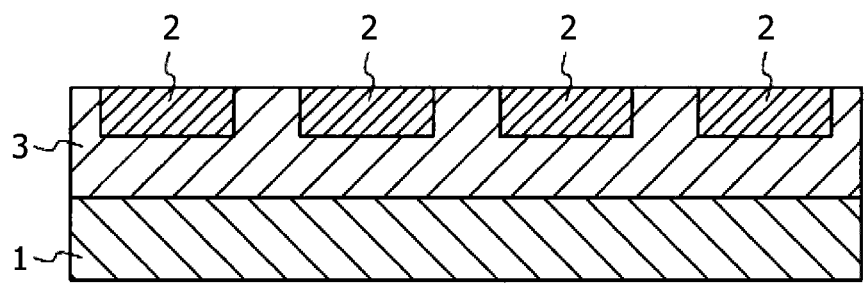
FIG. 2 depicts a schematic cross-sectional view illustrating a cross section of a sliding member according to the first embodiment, where the base is a hard coating.

FIG. 2 illustrates a schematic cross-sectional view of an exemplary sliding member according to the first embodiment, where the base is a hard coating. With reference to FIG. 2, the sliding member has a structure as follows. The sliding member has a substrate 1 and a hard coating 3 provided on the substrate 1. Concavities are provided on the hard coating 3, into which a second material is charged to form a filling part 2. The second material differs from the hard coating 3 in at least one of frictional coefficient and hardness. The hard coating 3 and the filling part 2 define a sliding surface and are substantially flush with each other in the sliding surface.

A sliding member according to the second embodiment of the present invention corresponds to the sliding member according to the first embodiment, except for further including an interlayer lying between the base and the filling part, and thereby has further better property or properties. Specifically, the sliding member according to the second embodiment has a sliding surface, which sliding surface includes a base, a filling part, and an interlayer. The base includes a first material and has concavities regularly arranged in the sliding surface. The filling part includes a second material and is arranged in the sliding surface to fill the concavities. The interlayer lies between the base and the filling part and includes a third material. Also in this embodiment, the base is exemplified by a substrate and a hard coating.

Figure 3:
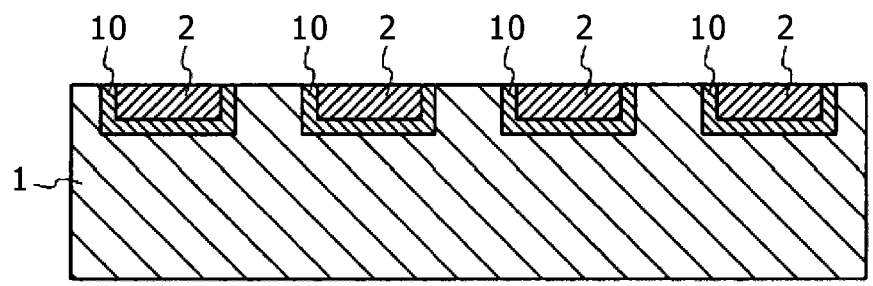
FIG. 3 depicts a schematic cross-sectional view illustrating a cross section of a sliding member according to the second embodiment, where the base is a substrate.

FIG. 3 illustrates a schematic cross-sectional view of an exemplary sliding member according to the second embodiment, where the base is a substrate. With reference to FIG. 3, the sliding member has a structure as follows. Concavities are provided on a substrate 1 including a first material. A second material is charged into the concavities to form a filling part 2. The second material differs from the substrate 1 (first material) in at least one of frictional coefficient and hardness. An interlayer 10 including a third material lies between the substrate 1 and the filling part 2. The third material may be:

(A) a material having high affinity with the first material and/or the second material; or (B) a material differing from the first material and/or the second material in at least one of frictional coefficient and hardness. In FIG. 3, the substrate 1, the filling part 2, and the interlayer 10 define a sliding surface and are substantially flush with one another in the sliding surface.

Figure 4:
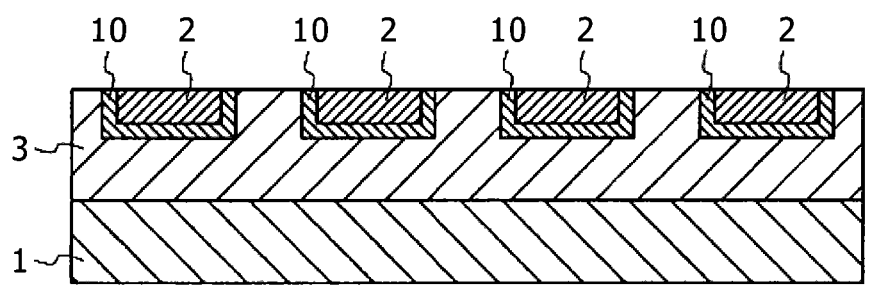
FIG. 4 depicts a schematic cross-sectional view illustrating a cross section of a sliding member according to a third embodiment, where the base is a hard coating.

Next, FIG. 4 illustrates a schematic cross-sectional view of an exemplary sliding member according to the second embodiment, where the base is a hard coating. With reference to FIG. 4, the sliding member has a structure as follows. The sliding member has a substrate 1 and a hard coating (base) 3 provided over the substrate 1. Concavities are provided on the hard coating 3, into which a second material is charged to form a filling part 2. The second material differs from the hard coating 3 in at least one of frictional coefficient and hardness. An interlayer 10 including a third material lies between the hard coating 3 and the filling part 2. The third material may be:

(A) a material having high affinity with the first material and/or the second material; or (B) a material differing from the first material and/or the second material in at least one of frictional coefficient and hardness. In FIG. 4, the hard coating 3, the filling part 2, and the interlayer 10 define a sliding surface and are substantially flush with one another in the sliding surface.

As illustrated in FIGS. 1 to 4, a surface of the base and a surface of the filling part 2 define a single plane as a sliding surface. By this, the sliding surface can enjoy properties of both the base and the filling part 2 without deterioration. When an interlayer 10 is provided, the term "surface of the filling part" further includes a surface of the interlayer 10 lying between the surface of the base and the surface of the filling part 2.

An area percentage of the filling part 2 in the sliding surface is preferably from 0.05% to 55%. The filling part 2, if occupying the sliding surface in an area percentage of less than 0.05%, may fail to sufficiently exhibit its performance because the performance of the base becomes predominant. To prevent this, the area percentage of the filling part 2 in the sliding surface is preferably 0.05% or more, more preferably 0.07% or more, furthermore preferably 0.10% or more, still more preferably 0.12% or more, and particularly preferably 0.15% or more. In contrast, the filling part 2, if occupying the sliding surface in an area percentage of greater than 55%, may predominantly exhibit its performance, and the resulting sliding member may exhibit performance similar to (not better than) that of the filling part alone. To prevent this, the area percentage of the filling part 2 in the sliding surface is preferably 55% or less, more preferably 50% or less, furthermore preferably 40% or less, still more preferably 30% or less, and particularly preferably 20% or less.

In an embodiment, the concavities include holes. In this embodiment, each of the holes preferably has an opening area of from 0.5 $\mu m^2$ to 4 $mm^2$. Holes each having an opening area of less than 0.5 $\mu m^2$ may be difficult to be worked and impede exhibition of the performance of the filling part because the performance of the base becomes predominant. To prevent this, the holes each have an opening area of preferably 0.5 $\mu m^2$ or more, more preferably 10 $\mu m^2$ or more, and furthermore preferably 100 $\mu m^2$ or more. In contrast, holes each having an opening area of greater than 4 $mm^2$ may cause the filling part to predominantly exhibit its performance, and the resulting sliding member may exhibit performance similar to (not better than) that of the filling part alone. To prevent this, the holes each have an opening area of preferably 4 $mm^2$ or less, more preferably 0.25 $mm^2$ or less, and furthermore preferably 0.016 $mm^2$ or less.

Possible shapes or forms of holes, when included in the concavities, are exemplified by, but not limited to, circle, ellipse, square, rectangular, polygonal, star, and other various forms. These concavities have only to be regularly arranged. Typically, the concavities may be aligned or staggered (arranged in a zigzag manner). Regular arrangement of the concavities in such a manner allows the filling part to exhibit its effects sufficiently and stably.

In another embodiment, the concavities include trenches (grooves). In this embodiment, each of the trenches preferably has a width of from 0.8 $\mu m$ to 2 mm. Trenches each having a width of less than 0.8 $\mu m$ may be difficult to be worked and impede exhibition of the performance of the filling part because the performance of the base becomes predominant. To prevent this, the trenches each have a width of preferably 0.8 µm or more, more preferably 1.0 µm or more, and furthermore preferably 10 µm or more. In contrast, trenches each having a width of greater than 2 mm may cause the filling part to predominantly exhibit its performance, and the resulting sliding member may exhibit performance similar to (not better than) that of the filling part alone. To prevent this, the trenches each have a width of preferably 2 mm or less, more preferably 1 mm or less, and furthermore preferably 0.5 mm or less.

Possible shapes or forms of trenches, when included in the concavities, are exemplified by, but not limited to, stripes, concentric circles, spirals, crosses, and a grid pattern. Arrangements such as line intervals of the trenches should be regular, regardless of the form or shape of the trenches. Regular arrangement of the concavities in such a manner allows the effects to be exhibited sufficiently and stably.

The concavities in the present invention may have a composite structure including both the hole structure and the trench structure.

FIGS. 5(a) to 5(h) illustrate exemplary concavity patterns in an embodiment using a disc-like base. FIGS. 5(a) to 5(e) illustrate concavity patterns including holes; and FIGS. 5(f) to 5(h) illustrate concavity patterns including trenches. It should be noted, however, that these concavity patterns are for illustrative purpose only and not intended to limit the scope of the present invention.

The concavities preferably have a maximum depth of from 0.05 µm to 5.0 µm.

A filling part in concavities having a maximum depth of less than 0.05 µm may rapidly become lost due to abrasion and fail to continuously exhibit its effects. To prevent this, the concavities have a maximum depth of preferably 0.05 µm or more, more preferably 0.07 µm or more, and furthermore preferably 0.1 µm or more. In contrast, it takes long time to work concavities having a maximum depth of greater than 5.0 µm and to fill the concavities with a second material to form a filling part 2, thus being disadvantageous in production. To prevent this, the concavities have a maximum depth of preferably 5.0 µm or less, more preferably 3.0 µm or less, and furthermore preferably 2.0 µm or less.

Materials for constituting sliding members according to the first and second embodiments of the present invention will be illustrated below.

A first material constituting the base and a second material constituting the filling part essentially differ from each other in at least one of frictional coefficient and hardness, as described above. Specific materials for use as the first and second materials, however, are not limited, as long as being those used in sliding members.

The first material constituting the base may include one material selected from the group consisting of metallic materials, ceramic materials, and carbonaceous materials.

When the base is a substrate 1, the metallic materials are exemplified by pure metals or alloys, such as stainless steels, other steels, pure titanium, titanium alloys, pure aluminum, aluminum alloys, pure copper, copper alloys, magnesium, and hard metals (cemented carbide alloys). The ceramic materials are exemplified by carbides, nitrides, borides, and composite ceramic materials of them. A surface of the substrate 1 may be ceramized by a surface modification process such as nitriding or carburizing.

When the base is a hard coating 3, the metallic materials are exemplified by pure metals or alloys, such as stainless steels, other steels, pure titanium, titanium alloys, pure aluminum, aluminum alloys, pure copper, copper alloys, magnesium, and hard metals. The ceramic materials are exemplified by carbides, nitrides, borides, and composite ceramic materials of them. The carbonaceous materials are preferably exemplified by graphite, diamond-like carbon, and diamond.

When the base is a hard coating 3, the hard coating 3 lies on or over a substrate 1. A material constituting the substrate 1 in this case is also not limited. The material for the substrate 1 usable herein is exemplified by pure metals or alloys, such as stainless steels, other steels, pure titanium, titanium alloys, pure aluminum, aluminum alloys, pure copper, copper alloys, magnesium, and hard metals; and ceramics such as carbides, nitrides, borides, and composite ceramic materials of them.

The hard coating 3 may lie directly on the substrate 1 or may lie on a primary layer which lies on the substrate 1. Specifically, the sliding member may further include a primary layer between the substrate 1 and the hard coating 3 to improve adhesion between them. The primary layer is exemplified by a layer including a pure metal or alloy including at least one metal element contained in the substrate 1 and/or the hard coating 3; and a layer including a nitride, carbide, or carbonitride of at least one metal element contained in the substrate 1 and/or the hard coating 3.

The primary layer may be any of a single layer having a single composition, a multilayer including two or more layers, and a composition-graded layer. The multilayered primary layer including two or more layers is exemplified by a multilayer structure including two or more layers, in which a layer facing the substrate 1 has high adhesion to a material constituting the substrate 1; and a layer facing the hard coating 3 has high adhesion to a material constituting the hard coating 3. The primary layer as a composition-graded layer is exemplified by a film having a composition-graded structure, in which the composition is near to the composition of the substrate 1 in the vicinity of the substrate 1 and approaches the composition of the hard coating 3 from the substrate 1 toward the hard coating 3. Specifically, in the film having the composition-graded structure, a layer in the vicinity of the substrate 1 includes a material constituting the substrate 1 or a material having high adhesion to the material constituting the substrate 1, and the ratio or content of a material constituting the hard coating 3 or a material having high adhesion to the material constituting the hard coating 3 increases while the layer approaching the hard coating 3.

A hard coating 3 having a thickness of greater than 50 µm, when serving as the base, may have large internal stress to cause peeling off (delamination). To prevent this, the hard coating 3 has a thickness of preferably 50 µm or less, more preferably 40 µm or less, and furthermore preferably 30 µm or less. A hard coating 3 having a thickness of less than 0.1 µm may exhibit insufficient abrasion resistance, because even the hard coating 3 will be worn. To prevent this, the hard coating 3 has a thickness of preferably 0.1 µm or more, more preferably 0.4 µm or more, and furthermore preferably 0.5 µm or more.

The primary layer preferably has a thickness of 0.001 µm or more. The "thickness" herein and hereinafter refers to a total thickness in the case of a multilayered structure. A primary layer having a thickness less than this range may hardly ensure sufficient adhesion, because the substrate surface may have an area where no primary layer is present. The primary layer more preferably has a thickness of 0.005 µm or more. In contrast, a primary layer having an excessively large thickness may have larger asperities on its surface due typically to crystal growth of the primary layer. This may often invite a larger surface roughness of the hard coating to be formed on the primary layer to impede working. To prevent this, the primary layer has a thickness of preferably 10 μm or less and more preferably 5 μm or less.

The second material constituting the filling part 2 includes at least one material selected from the group consisting of metallic materials, ceramic materials, and carbonaceous materials. The second material, however, is not limited to a specific material, as long as selected from these categories.

Specifically, the metallic materials are exemplified by pure metals or alloys, such as stainless steels, other steels, pure titanium, titanium alloys, pure aluminum, aluminum alloys, pure copper, copper alloys, magnesium, and hard metals. The ceramic materials are exemplified by carbides, nitrides, borides, and composite ceramic materials of them. The carbonaceous materials are exemplified by graphite, diamond-like carbon, and diamond.

The third material constituting the interlayer 10 includes at least one material selected from the group consisting of metallic materials, ceramic materials, and carbonaceous materials.

Specifically, the metallic materials are exemplified by pure metals or alloys, such as stainless steels, other steels, pure titanium, titanium alloys, pure aluminum, aluminum alloys, pure copper, copper alloys, magnesium, and hard metals. The ceramic materials are exemplified by carbides, nitrides, borides, and composite ceramic materials of them. The carbonaceous materials are exemplified by graphite, diamond-like carbon, and diamond.

The third material may be selected from among the listed materials, in view of property or properties further desired and types of the first and second materials to be employed.

When better adhesion between the base (first material) and the filling part 2 (second material) is further desired, the material (A) having high affinity with the first material and/or the second material is preferably used as the third material. Specifically, the third material in this case is exemplified by:
(A-1) a material the same as the first material and/or a material having high affinity with the first material;
(A-2) a material the same as the second material and/or a material having high affinity with the second material; and
(A-3) a composite material as a mixture of the materials (A-1) and (A-2). The material (A-3) is exemplified by a composite material of a material (I) and a material (II). The material (I) is a material the same as the first material and/or a material having high affinity with the first material. The material (II) is a material the same as the second material and/or a material having high affinity with the second material.

When the first material and/or the second material (hereinafter also referred to as a "first/second material") is a metallic material, exemplary third materials having high affinity with the metallic material are as follows:
(i) a pure metal of a metal element that readily forms an alloy with the metallic material (e.g., particularly a pure metal), or an alloy containing the metal element, or a compound containing the metal element constituting the pure metal or alloy; and
(ii) a compound (e.g., carbide, nitride, carbonitride, or boride) containing a metal element constituting the first/second material.

More specifically, when the first/second material is a stainless steel, a third material having high affinity with the stainless steel is exemplified by pure metals such as aluminum, titanium, chromium, and tungsten; alloys including at least one of these metals; and compounds (e.g., carbides, nitrides, carbonitrides, and borides) containing at least one of these metals. Likewise, assume that the first/second material is a structural alloy steel such as S15CK, SNC415, SNC836, SNCM220, SNCM415, SNCM630, SCr415, SCr445, SCM415, SCM445, SMn420, SMnC420, or SMnC443, in which the alloy steel may be carburized or nitrided. In this case, a third material having high affinity with the alloy steel is exemplified by pure metals such as aluminum, titanium, chromium, and tungsten; alloys including at least one of these metals; and compounds (e.g., carbides, nitrides, carbonitrides, and borides) containing at least one of these metals.

When the first/second material is pure titanium, a third material having high affinity therewith is exemplified by pure metals such as aluminum, titanium, chromium, and tungsten; alloys including at least one of these metals; and compounds (e.g., carbides, nitrides, carbonitrides, and borides) containing at least one of these metals. When the first/second material is a titanium alloy, a third material having high affinity therewith is exemplified by pure metals such as aluminum, titanium, chromium, and tungsten; alloys including at least one of these metals; and compounds (e.g., carbides, nitrides, carbonitrides, and borides) containing at least one of these metals.

When the first/second material is pure aluminum, a third material having high affinity therewith is exemplified by pure metals such as aluminum, titanium, chromium, and tungsten; alloys including at least one of these metals; and compounds (e.g., carbides, nitrides, carbonitrides, and borides) containing at least one of these metals. When the first/second material is an aluminum alloy, a third material having high affinity therewith is exemplified by pure metals such as aluminum, titanium, chromium, and tungsten; alloys including at least one of these metals; and compounds (e.g., carbides, nitrides, carbonitrides, and borides) containing at least one of these metals.

When the first/second material is pure copper, a third material having high affinity therewith is exemplified by pure metals such as aluminum, copper, titanium, chromium, and tungsten; alloys including at least one of these metals; and compounds (e.g., carbides, nitrides, carbonitrides, and borides) containing at least one of these metals. When the first/second material is a copper alloy, a third material having high affinity therewith is exemplified by pure metals such as aluminum, copper, titanium, chromium, and tungsten; alloys including at least one of these metals; and compounds (e.g., carbides, nitrides, carbonitrides, and borides) containing at least one of these metals.

When the first/second material is magnesium, a third material having high affinity therewith is exemplified by pure metals such as aluminum, magnesium, titanium, chromium, and tungsten; alloys including at least one of these metals; and compounds (e.g., carbides, nitrides, carbonitrides, and borides) containing at least one of these metals.

When the first/second material is a hard metal, a third material having high affinity therewith is exemplified by pure metals such as aluminum, titanium, chromium, and tungsten; alloys (inclusive of hard metals) containing at least one of these metals; and compounds (e.g., carbides, nitrides, carbonitrides, and borides) containing at least one of these metals.

When the first/second material is a ceramic material, a third material having high affinity therewith is exemplified by metallic materials (pure metals and alloys) including at least one metal element (e.g., aluminum, copper, magnesium, titanium, chromium, or tungsten) constituting the ceramic material as the first/second material. The third material in this case is further exemplified by compounds (e.g., carbides, nitrides, carbonitrides, and borides) which contain at least one metal element constituting the ceramic material as the first/second material, and which contain a non-metal element different from that of the ceramic material.

More specifically, when the first/second material is a carbide, a third material having high affinity therewith is exemplified by a pure metal of a metal element constituting the carbide; alloys containing the metal element; and nitrides and borides containing the metal element. When the first/second material is a nitride, a third material having high affinity therewith is exemplified by a pure metal of a metal element constituting the nitride; alloys containing the metal element; and carbides and borides containing the metal element. When the first/second material is a boride, a third material having high affinity therewith is exemplified by a pure metal of a metal element constituting the boride; alloys containing the metal element; and nitrides and carbides containing the metal element. When the first/second material is a composite ceramic material of a carbide, a nitride, and a boride, a third material having high affinity therewith is exemplified by the carbide, nitride, and boride constituting the composite material.

Furthermore specifically, when the first/second material is a nitride, carbide, or carbonitride (corresponding typically to a hard coating) of at least one element selected from the group consisting of Ti, Cr, Al, and Si, a third material having high affinity therewith is exemplified by a corresponding compound (nitride, carbide, or carbonitride) containing the same metal element as, but a different non-metal element from, the above compound.

When the first/second material is a carbonaceous material, a third material having high affinity therewith is exemplified by pure metals such as aluminum, titanium, chromium, and tungsten; alloys including at least one of these metals; and carbides and carbonitrides containing at least one of these metals.

More specifically, when the first/second material is graphite, a third material having high affinity therewith is exemplified by pure metals such as aluminum, titanium, chromium, and tungsten; alloys including at least one of these metals; and carbides and carbonitrides containing at least one of these metals. When the first/second material is diamond-like carbon, a third material having high affinity therewith is exemplified by pure metals such as aluminum, titanium, chromium, and tungsten; alloys including at least one of these metals; and carbides and carbonitrides containing at least one of these metals. When the first/second material is diamond, a third material having high affinity therewith is exemplified by pure metals such as aluminum, titanium, chromium, and tungsten; alloys including at least one of these metals; and carbides and carbonitrides containing at least one of these metals.

When a further lower frictional coefficient or further better durability than that of a sliding member according to the first embodiment is desired, the third material may be a material (B) differing from the first/second material in at least one of frictional coefficient and hardness, as described above.

The interlayer 10 has a thickness of preferably 0.005 μm or more. The term "thickness" herein refers to a total thickness when the interlayer is a multilayer. An interlayer having a thickness of less than 0.005 μm may cause a region or regions that do not serve as an interlayer 10. The interlayer 10 has a thickness of more preferably 0.01 μm or more. In contrast, an interlayer having a thickness of greater than 2.0 μm may affect the surface and weaken the effects of the filling part. To prevent this, the interlayer 10 has a thickness of preferably 2.0 μm or less and more preferably 1.0 μm or less.

The interlayer may be a single layer having a single composition or be a multilayered interlayer including two or more layers. The multilayered interlayer is exemplified by a multilayer structure including two or more layers, in which a layer facing the base (first material) has high affinity (particularly adhesion) with the first material, and a layer facing the filling part (second material) has high affinity (particularly adhesion) with the second material. The interlayer may be a composition-graded layer having a composition graded in a thickness direction thereof. In such a composition-graded layer, a region (layer) in the vicinity typically of the base (first material) contains, in a high content, the first material or a material having high affinity with the first material. With approaching the filling part (second material), the content of the first material or the material having high affinity with the first material decreases, whereas the content of the second material or a material having high affinity with the second material increases. A region in the vicinity of the filling part (second material) contains, in a high content, the second material or the material having high affinity with the second material.

When the base is the substrate 1, preferred combinations between the first material constituting the substrate 1 and the second material constituting the filling part 2 include combinations (i) to (iv) as follows:

(i) A combination of
the substrate 1 (first material) as a structural alloy steel (e.g., S15CK, SNC415, SNCM415, SCr415, SCM415, SMn420, or SMnC420) which has been carburized; and
the filling part 2 (second material) as a nitride or carbonitride of at least one element selected from the group consisting of Ti, Cr, Al, and Si.

(ii) A combination of:
the substrate 1 (first material) as a structural alloy steel (e.g., SNC415, SNC836, SNCM220, SNCM630, SCr415, SCr445, SCM415, SCM445, SMn420, or SMnC443) which has been nitrided; and
the filling part 2 (second material) as diamond-like carbon, or a nitride or carbonitride of at least one element selected from the group consisting of Ti, Cr, Al, and Si.

(iii) A combination of:
the substrate 1 (first material) as an aluminum alloy; and
the filling part 2 (second material) as a nitride, carbide, or carbonitride of at least one element selected from the group consisting of Ti, Cr, Al, and Si.

(iv) A combination of:
the substrate 1 (first material) as a titanium alloy; and
the filling part 2 (second material) as diamond-like carbon, or a nitride, carbide, or carbonitride of at least one element selected from the group consisting of Ti, Cr, Al, and Si.

When the base is the hard coating 3, preferred combination of the substrate 1 underlying the hard coating 3, the first material constituting the hard coating 3, and the second material constituting the filling part 2 include combinations (v) to (viii) as follows:

(v) A combination of:
the substrate 1 as a structural alloy steel (e.g., SNC415, SNC836, SNCM220, SNCM630, SCr415, SCr445, SCM415, SCM445, SMn420, or SMnC443) which has been nitrided;
the hard coating 3 (first material) as a nitride of at least one element selected from the group consisting of Ti, Cr, Al, and Si; and the filling part 2 (second material) as a carbide of at least one element selected from the group consisting of Ti, Cr, Al, and Si.

(vi) A combination of:

the substrate 1 as a structural alloy steel (e.g., SNC415, SNC836, SNCM220, SNCM630, SCr415, SCr445, SCM415, SCM445, SMn420, or SMnC443) which has been nitrided;

the hard coating 3 (first material) as a carbide of at least one element selected from the group consisting of Ti, Cr, Al, and Si; and the filling part 2 (second material) as diamond-like carbon, or a nitride or carbonitride of at least one element selected from the group consisting of Ti, Cr, Al, and Si.

(vii) A combination of:

the substrate 1 as an aluminum alloy;

the hard coating 3 (first material) as a nitride of at least one element selected from the group consisting of Ti, Cr, Al, and Si; and the filling part 2 (second material) as diamond-like carbon, or a carbide of at least one element selected from the group consisting of Ti, Cr, Al, and Si.

(viii) A combination of:

the substrate 1 as a titanium alloy;

the hard coating 3 (first material) as a nitride of at least one element selected from the group consisting of Ti, Cr, Al, and Si; and the filling part 2 (second material) as diamond-like carbon, or a carbide of at least one element selected from the group consisting of Ti, Cr, Al, and Si.

In the preferred combinations (i) to (viii), an interlayer (third material) may be further arranged for better adhesion between the base (first material) and the filling part (second material). The third material in this case is exemplified by:

(A-1) a material having the same composition as, and/or a material having high affinity with, the first material in the combinations (i) to (viii); and (A-2) a material having the same composition as, and/or a material having high affinity with, the second material in the combinations (i) to (viii). The third material may also be a composite material as the mixture of the materials (A-1) and (A-2).

In the preferred combinations (i) to (viii), an interlayer 10 (third material) may be further arranged for a lower frictional coefficient and better durability than those of a sliding member according to the first embodiment. The third material in this case may be a material differing from the first/second material in the combinations (i) to (viii) in at least one of frictional coefficient and hardness.

The present invention further includes a method for manufacturing a sliding member according to the first embodiment. The manufacturing method includes the steps of:

covering a part of a base (a base including the first material) having no concavities with a mask (first step) to give a partially masked base;

etching the partially masked base to give an etched base (second step);

depositing a film of the second material on the etched base through vapor deposition to form a filling part (third step);

removing the mask from the base to give a work including the base and the filling part (fourth step); and polishing the work so that the base and the filling part are substantially flush with each other to form the sliding surface (fifth step).

The present invention further includes a method for manufacturing a sliding member according to the second embodiment. The manufacturing method includes the steps of:

covering a part of a base (base including the first material) having no concavities with a mask to give a partially masked base (first step);

etching the partially masked base to give an etched base (second step);

depositing a film of the third material on the etched base through vapor deposition to form an interlayer (second-bis step);

depositing a film of the second material on the interlayer through vapor deposition to form a filling part (third step);

removing the mask from the base to give a work including the base, the filling part, and the interlayer (fourth step); and polishing the work so that the base, the filling part, and the interlayer are substantially flush with one another to form the sliding surface.

The respective steps will be illustrated below.

The first step covers a part of a base (base including the first material) having no concavities with a mask. The mask in this stage has no exposing regions.

The base before the formation of (covering with) the mask is preferably cleaned for better adhesion between the base and the mask to be formed thereon. The cleaning should be performed with a substance that does not cause the base to deteriorate. The cleaning may for example be performed by ultrasonic cleaning in an organic solvent or an alkaline solution. The method does not have to include the cleaning step when the base surface is verified to be sufficiently clean.

The mask may be derived from a photosensitive resin (resist). Etching of the base with a photosensitive resin (resist) as the mask forms concavities. The photosensitive resin is a material in which an exposed portion is modified or altered, which exposed portion has been exposed typically to light, an ultraviolet ray, or a beam of electrons is modified. The photosensitive resin can be any of a positive type photosensitive resin and a negative type photosensitive resin. In the positive type photosensitive resin, the exposed and modified portion is etched with (dissolved in) a solution. In the negative type photosensitive resin, portions other than the exposed and modified portion are etched with a solution. The photosensitive resin for use herein can be selected from among various photosensitive resins suitably according typically to the required size. Photosensitive resins for use in printed circuit boards are easy and simple to use.

The mask (resist) may have a thickness not critical, but preferably has a thickness of 5 µm or more for preventing loss of the mask (e.g., laminate film) in the second step.

Initially, a patterning master plate is prepared to a predetermined shape. The master plate will be illustrated in detail later. The mask on the base is irradiated typically with light, an ultraviolet ray, or a beam of electrons through the master plate. Only a portion not covered by the master plate can be exposed to and modified by the light, ultraviolet ray, or beam of electrons. By rinsing in an alkaline solution (e.g., a sodium carbonate aqueous solution), only the exposed and modified resist portion or only a non-exposed resist portion is removed or dissolved depending on the type (negative type or positive type) of the resist. In the resulting work, a part of the base is exposed, while the other part is covered by the mask.

Figure 5:
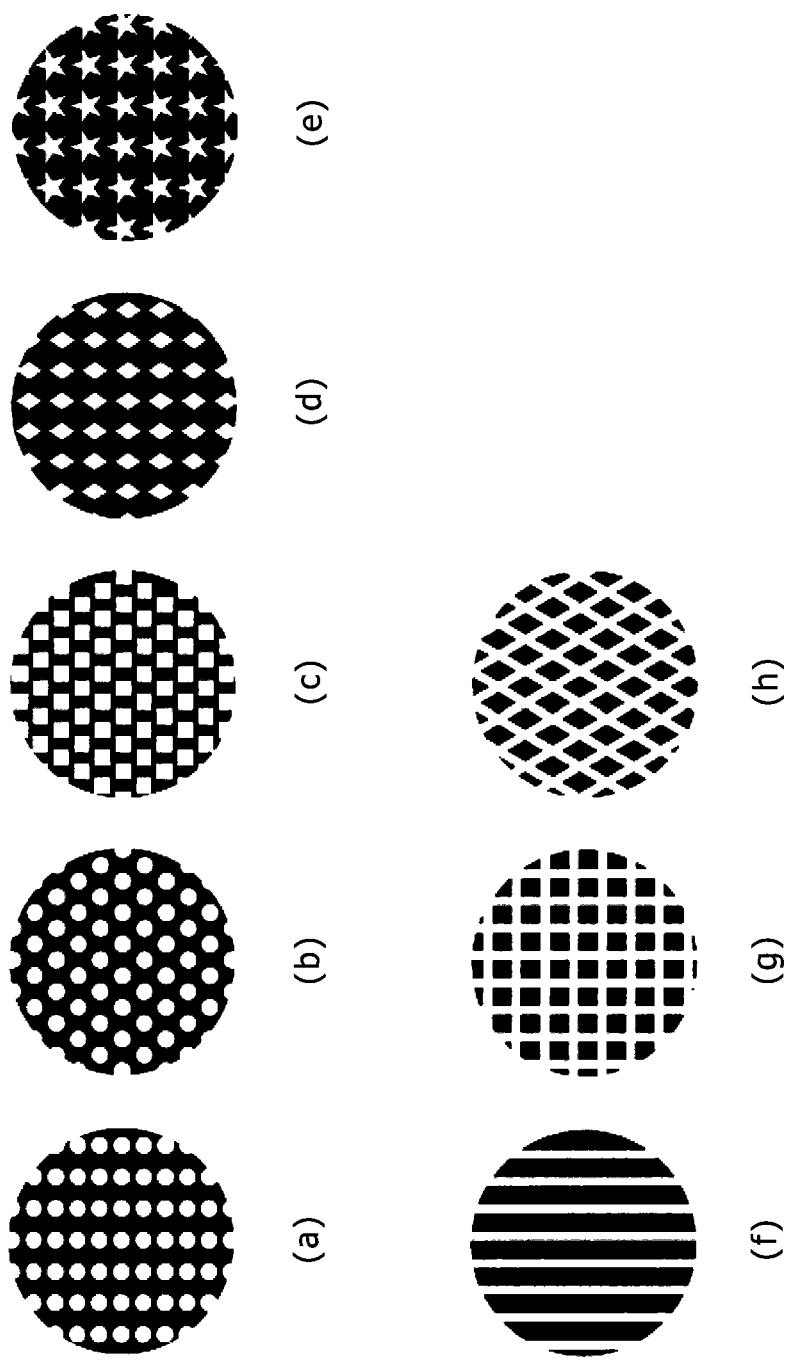
FIGS. 5(a) to 5(h) depict plan views illustrating arrangements of the filling part.

The mask preferably has two or more masking regions and two or more exposing regions, in which the masking regions and the exposing regions are regularly arranged. The mask having this configuration can give a sliding surface including a regularly arranged filling part, typically as illustrated in FIG. 5.

To form a mask having masking regions and exposing regions both regularly arranged, a master plate being patterned to a regular arrangement pattern may be used. The master plate may be prepared typically by laser beam patterning or chemical etching. The prepared master plate is reusable many times. This provides overwhelmingly higher productivity than that of direct patterning of a substrate by laser beam patterning or chemical etching. In addition to the patterns illustrated in FIG. 5, a wide variety of patterns can be employed. In any case, a pattern to be used importantly has a regularity.

The second step etches the partially masked base to form concavities in the base. The etching is preferably performed through ion bombardment.

The present inventors made investigations as follows on various ways to form concavities.

Initially, the present inventors considered the use of various lasers (e.g., a fiber laser and a femtosecond laser) to form concavities. After investigations, however, they found that the working by laser is disadvantageously hardly controlled in the depth direction and requires a long time. They also made investigations on a working by cutting or grinding. They found, however, that the working disadvantageously suffers from burrs at worked edges, which burrs adversely affect the slidability; that the working requires a long time; and that a cutting tool may be damaged upon cutting when the substrate includes a material of some type. They further made investigations on a technique of forming a metallic mask and shot-blasting the base over the mask to form concavities. They found, however, that this technique also suffers from burrs at worked edges as in the working by cutting or grinding, which burrs adversely affect the slidability; and that the technique hardly controls concavities in the thickness direction. They further made investigations on wet etching with an etchant. They found, however, that this technique also disadvantageously hardly controls depths of concavities; and that the etchant may migrate into another portion than the non-masked portion to etch the entire base when the base includes a material of some type. The other portion than the non-masked portion is a masked portion and not intended to be etched in ordinary cases.

The present inventors have found that the disadvantages of these techniques can be solved by performing etching, particularly dry etching such as reactive gas etching or ion milling. They have further found that, of these dry etching techniques, ion bombardment is preferred to solve the disadvantages.

The ion bombardment less suffers from burrs at worked edges, enables control in the depth direction, and enables reduction in working time. The ion bombardment may be performed with etching-dedicated equipment, but is usefully performed in a vacuum deposition chamber. This allows sequential performing of a subsequent step of filling the filling part with the second material and contributes to time reduction.

Specifically, the ion bombardment may be performed by procedures as follows.

Typically, the ion bombardment may be performed by employing ion bombardment effects through a chemical vapor deposition (CVD) using a low-reactive inert gas (rare gas) such as argon gas or xenon gas; or employing reactive ion bombardment effects through a chemical vapor deposition (CVD) using a reactive gas such as oxygen gas or nitrogen gas. The ion bombardment may also be performed as in CVD, by ionizing an inert gas (such as argon gas or xenon gas) or a reactive gas (such as oxygen gas or nitrogen gas) with a hot filament assistance as in unbalanced magnetron sputtering (DBMS) equipment. However, any procedure can be employed, as long as using ion bombardment.

The working depth in the ion bombardment can be controlled typically by selecting the gas type according to the substrate type; and controlling a negative bias voltage to be applied to the substrate and/or controlling the treatment time both in CVD and the hot-filament assisted process. A biasing power source can be of any type, such as a direct-current (DC) power source, a pulsed DC power source, an RF power source, or a high-power pulsed DC power source. The biasing power source may be changed according to the substrate type and working procedure.

To manufacture a sliding member according to the second embodiment, the method further includes a second-bis step between the second step and a third step mentioned later. The third step is the step of depositing a film of the second material through vapor deposition to form a filling part. The second-bis step is the step of depositing a film of the third material on the etched base through vapor deposition to form an interlayer.

The vapor deposition in the second-bis step may be performed by a technique suitably selected from among various techniques according to the type of the filling part and the working depth of the concavities.

Techniques for the vapor deposition are exemplified by vacuum film deposition processes including physical vapor deposition such as vacuum evaporation, sputtering (including unbalanced magnetron sputtering), arc ion plating (AIP); and chemical vapor deposition (CVD). Deposition of a film of a metal, carbon, boron, or a compound of them by physical vapor deposition may be performed in the presence of an inert gas such as argon gas, or in the absence of a gas. To deposit a nitride or carbide, reactive film deposition using nitrogen gas, a hydrocarbon gas may also be employed instead of the above techniques.

To manufacture a sliding member according to the first embodiment, the third step deposits a film of the second material through vapor deposition on the etched base to form a filling part, which etched base has been obtained from the second step. To manufacture a sliding member according to the second embodiment, the third step deposits a film of the second material through vapor deposition on the interlayer to form a filling part, which interlayer has been obtained from the second-bis step.

The vapor deposition may be performed by a technique suitably selected from among various techniques according to the type of the filling part and the working depth of the concavities.

Techniques for the vapor deposition are exemplified by vacuum film deposition processes including physical vapor deposition such as vacuum evaporation, sputtering (including unbalanced magnetron sputtering), arc ion plating (AIP); and chemical vapor deposition (CVD). Deposition of a film of a metal, carbon, boron, or a compound of them by physical vapor deposition may be performed in the presence of an inert gas such as argon gas, or in the absence of a gas. To deposit a nitride or carbide, reactive film deposition using nitrogen gas, a hydrocarbon gas may also be employed instead of the above techniques.

The fourth step removes the mask from the base. In the base, the concavities have been filled with the second material in the third step in the first embodiment; whereas the concavities have been filled with the third material and the second material in the antecedent steps in the second embodiment.

A mask stripper selected according to the resist type may be used. Typically, the mask can be easily removed (stripped) by ultrasonic cleaning in a sodium hydroxide solution or an organic solvent (e.g., acetone). The mask material may partially remain even after the ultrasonic cleaning. This is because the mask may be partially modified due to exposure to high temperatures in the second and third steps, react with the hard coating or substrate, and exhibit higher adhesion therewith. However, even the residual mask material in this case does not affect, because it will be readily removed in the subsequent polishing step.

The fifth step polishes the work so that the base and the filling part are substantially flush with each other to form a sliding surface. To manufacture a sliding member according to the second embodiment, the fifth step polishes the work so that the base, the filling part surface, and the interlayer lying between them are substantially flush with one another.

The polishing in this manner forms a sliding surface without loss of properties of both the substrate and the filling part. A filling part, if extremely higher than (protrudes from) the base, may adversely affect the sliding. In a preferred embodiment, contamination of the filling part may be removed with an AERO LAP lapping machine before polishing. The contamination refers typically to microparticles formed by abnormal discharge upon film deposition. The polishing herein may be suitably selected from among various polishing techniques according to the material types of the base and the filling part and is exemplified by polishing with a sandpaper; buffing with a diamond paste; and polishing with an abrasive paper embedded with diamond. To verify that the components are flush with each other (define a single plane), a level difference at the interface between the filling part and the base may be measured typically with a surface roughness meter. A level difference between the base and the infill a part of ±0.5 µm is acceptable.

Steps for manufacturing a sliding member according to the first embodiment, where the base is a substrate 1, will be illustrated with reference to FIGS. 6(*a*) to 6(*h*). The details of the respective steps have been described above and will be omitted below. The same is true for an embodiment where the base is the hard coating, and for sliding members according to the second embodiment.

First Step: Initially, a substrate 1 bearing no concavities is prepared (FIG. 6(*a*)). A mask 4 is formed on the substrate 1 (FIG. 6(*b*)). The mask 4 includes a resist and has no exposing regions. The work is exposed through a master plate 5 (FIG. 6(*c*)). The exposing is indicated by arrows in FIG. 6(*c*). FIG. 6(*d*) illustrates the mask 4 as formed by exposing the work and rinsing the exposed work typically with an alkaline solution to remove exposed portions.

Second Step: The substrate 1 is subjected to etching (FIG. 6(*e*)), thereby non-masked portions in the surface of the substrate 1 are etched to form concavities (FIG. 6(*f*)). The etching is indicated by arrows in FIG. 6(*e*).

Third Step: A film of the second material is deposited on the etched substrate 1 by the technique to fill the concavities with the second material to thereby form a filling part 2 (FIG. 6(*g*)). The film deposition is indicated by arrows in FIG. 6(*g*).

Fourth and Fifth Steps: The mask 4, as well as the second material present on the mask 4, are removed from the substrate 1, and the work is polished so that the substrate 1 and the filling part 2 are substantially flush with each other (FIG. 6(*h*)).

Steps for manufacturing a sliding member according to the first embodiment, where the base is a hard coating 3, will be illustrated with reference to FIGS. 7(*a*) to 7(*h*).

First Step: Initially, a hard coating 3 bearing no concavities is prepared (FIG. 7(*a*)). A mask 4 is formed on the hard coating 3 (FIG. 7(*b*)). The mask 4 includes a resist and has no exposing regions. The work is exposed through a master plate 5 (FIG. 7(*c*)). The exposing is indicated by arrows in FIG. 7(*c*). FIG. 7(*d*) illustrates the mask 4 as formed by exposing the work and rinsing the exposed work typically with an alkaline solution to remove exposed portions.

The hard coating may be formed on a substrate (or primary layer) by a technique which is not limited and choosable typically from among thermal spraying, plating, and vapor deposition techniques. Among them, suitable for easily obtaining a hard film (hard coating) are vacuum film deposition processes including physical vapor deposition (PVD) such as vacuum evaporation, sputtering (including unbalanced magnetron sputtering), and arc ion plating (AIP); and chemical vapor deposition (CVD). The hard coating preferably has a thickness of from 0.1 µm to 50 µm, as described above.

When a primary layer 9 is to be arranged between the substrate 1 and the hard coating 3 as illustrated in FIG. 7(*a*), the primary layer 9 may be formed by any technique choosable typically from among thermal spraying, plating, and vapor deposition techniques. Among them, suitable for easily obtaining a hard film (hard coating) are vacuum film deposition processes including physical vapor deposition (PVD) such as vacuum evaporation, sputtering (including unbalanced magnetron sputtering), and arc ion plating (AIP); and chemical vapor deposition (CVD).

Second Step: The hard coating 3 is subjected to etching (FIG. 7(*e*)), thereby non-masked portions in the surface of the hard coating 3 are etched to form concavities (FIG. 7(*f*)). The etching is indicated by arrows in FIG. 7(*f*).

Third Step: A film of the second material is deposited on the etched hard coating 3 by the technique to fill the concavities with the second material to thereby form a filling part 2 (FIG. 7(*g*)). The film deposition is indicated by arrows in FIG. 7(*g*).

Fourth and Fifth Steps: The mask 4, as well as the second material present on the mask 4, are removed from the hard coating 3 by the technique, and the work is polished so that the hard coating 3 and the filling part 2 are substantially flush with each other (FIG. 7(*h*)).

Steps for manufacturing a sliding member according to the second embodiment, where the base is a substrate 1, will be illustrated with reference to FIGS. 8(*a*) to 8(*i*).

First Step: Initially, a substrate 1 bearing no concavities is prepared (FIG. 8(*a*)). A mask 4 is formed on the substrate 1 (FIG. 8(*b*)). The mask 4 includes a resist and has no exposing regions. The work is exposed through a master plate 5 (FIG. 8(*c*)). The exposing is indicated by arrows in FIG. 8(*c*). FIG. 8(*d*) illustrates the mask 4 as formed by exposing the work and rinsing the exposed work typically with an alkaline solution to remove exposed portions.

Second Step: The substrate 1 is subjected to etching (FIG. 8(*e*)), thereby non-masked portions in the surface of the substrate 1 are etched to form concavities (FIG. 8(*f*)). The etching is indicated by arrows in FIG. 8(*e*).

Second-bis Step: A film of the third material is deposited on the etched substrate 1 by the technique (vapor deposition)

to form an interlayer 10 (FIG. 8(g)). The film deposition is indicated by arrows in FIG. 8(g).

Third Step: A film of the second material is deposited on the interlayer 10 by the technique (vapor deposition) to fill the concavities with the second material to thereby form a filling part 2 (FIG. 8(h)). The interlayer 10 has been deposited in the second-bis step and is a film of the third material. The film deposition is indicated by arrows in FIG. 8(h).

Fourth and Fifth Steps: The mask 4, as well as the third and second materials present on the mask 4, are removed from the substrate 1 by the technique. The work is then polished so that the substrate 1, the filling part 2, and the interlayer 10 lying between them are substantially flush with one another (FIG. 8(i)).

Steps for manufacturing a sliding member according to the second embodiment, where the base is a hard coating 3, will be illustrated with reference to FIGS. 9(a) to 9(i).

First Step: Initially, a hard coating 3 bearing no concavities is prepared (FIG. 9(a)). A mask 4 is formed on the hard coating 3 (FIG. 9(b)). The mask 4 includes a resist and has no exposing regions. The work is exposed through a master plate 5 (FIG. 9(c)). The exposing is indicated by arrows in FIG. 9(c). FIG. 9(d) illustrates the mask 4 as formed by exposing the work and rinsing the exposed work typically with an alkaline solution to remove exposed portions.

The hard coating 3 may be formed on the substrate 1 (or the primary layer 9) by a technique which is not limited and choosable typically from among thermal spraying, plating, and vapor deposition techniques. Among them, suitable for easily obtaining a hard film (hard coating) are vacuum film deposition processes including physical vapor deposition (PVD); and chemical vapor deposition (CVD). The physical vapor deposition (PVD) is exemplified by vacuum evaporation, unbalanced magnetron sputtering and other sputtering techniques, and arc ion plating (AIP). The hard coating 3 preferably has a thickness of from 0.1 μm to 50 μm, as described above.

When a primary layer 9 is to be arranged between the substrate 1 and the hard coating 3 as illustrated in FIG. 9(a), the primary layer 9 may be formed by any technique choosable typically from among thermal spraying, plating, and vapor deposition techniques. Among them, suitable for easily obtaining a hard film (hard coating) are vacuum film deposition processes including physical vapor deposition (PVD); and chemical vapor deposition (CVD). The physical vapor deposition (PVD) is exemplified by vacuum evaporation, unbalanced magnetron sputtering and other sputtering techniques, and arc ion plating (AIP).

Second Step: The hard coating 3 is subjected to etching (FIG. 9(e)), thereby non-masked portions in the surface of the hard coating 3 are etched to form concavities (FIG. 9(f)). The etching is indicated by arrows in FIG. 9(f).

Second-bis Step: A film 10 of the third material is deposited on the etched hard coating 3 by the technique (vapor deposition) to form an interlayer 10 (FIG. 9(g)). The film deposition is indicated by arrows in FIG. 9(g).

Third Step: A film of the second material is deposited on the interlayer 10 by the technique (vapor deposition) to fill the concavities with the second material to thereby form a filling part 2 (FIG. 9(h)). The interlayer 10 has been formed in the second-bis step and is a film including the third material. The film deposition is indicated by arrows in FIG. 9(h).

Fourth and Fifth Steps: The mask 4, as well as the third and second materials present on the mask 4, are removed from the hard coating 3 by the technique. The work is then polished so that the hard coating 3, the filling part 2, and the interlayer 10 lying between them are substantially flush with each other (FIG. 9(i)).

As used herein the term "sliding member" refers to a member that comes in contact with a counter part through rotation or reciprocation. Members of this category include all members to be used in dry environments or lubricative environments typically with oil or water. Specifically, the "sliding member" refers to sliding members typically in drive trains, internal combustion engines, oil hydraulic equipment, and water hydraulic equipment for use typically in automobiles, two-wheeled vehicles, construction machinery, and industrial robots. The sliding member may be exemplified by, in terms of part name, piston rings, piston pins, cams, shims, gears, bearings, and other members that come in contact with a counter part through rotation or reciprocation.

The sliding may be performed in any environment, such as an environment in the presence of a lubricative medium (e.g., hot water, water, or an oil), a gas (e.g., nitrogen, argon, oxygen, or hydrogen gas) environment, a vacuum environment, or a dry (atmospheric) environment. Sliding members according to embodiments of the present invention are usable in any environment.

The counter part for the sliding parts (sliding members) according to the present invention may be exemplified by pure metals or alloys, such as hard metals, stainless steels, pure titanium, titanium alloys, pure aluminum, aluminum alloys, pure copper, copper alloys, magnesium, and hard metals; ceramic materials such as carbides, nitrides, borides, and composite ceramic materials of them; and carbonaceous materials such as graphite, diamond-like carbon, and diamond. The counter part for a sliding part (sliding member) according to an embodiment of the present invention may also be a sliding member having a structure the same as or similar to that in the present invention.

While the present invention has been described with reference to embodiments and working examples thereof, it will be understood by those skilled in the art that the invention is not limited thereto, but various changes and modifications can be made without departing from the scope of the invention which is delineated by the appended claims. The present application is based on Japanese Patent Application No. 2011-029570 filed on Feb. 15, 2011 and Japanese Patent Application No. 2011-255270 filed on Nov. 22, 2011, the entire contents of which are incorporated herein by reference.

REFERENCE SIGNS LIST 1 substrate
2 filling part
3 hard coating
4 mask
5 master plate
9 primary layer
10 interlayer

The invention claimed is:

1. A sliding member comprising a sliding surface, the sliding surface comprising:
   a base; and
   a filling part,
   the base comprising a first material and having concavities regularly arranged in the sliding surface; and
   the filling part comprising a second material and arranged in the sliding surface to fill the concavities,
   wherein:

the first material comprises one material selected from the group consisting of metallic materials, ceramic materials, and carbonaceous materials;

the second material comprises at least one material selected from the group consisting of metallic materials, ceramic materials, and carbonaceous materials;

the first and second materials differ from each other in at least one of frictional coefficient and hardness, wherein the second material has a lower frictional coefficient and a higher hardness than the first material; and the base and the filling part are substantially flush with each other in the sliding surface, wherein the sliding member comprises a substrate and a hard coating, and the base is the hard coating.

2. The sliding member of claim 1, wherein an area percentage of the filling part in the sliding surface is from 0.05% to 55%.

3. The sliding member of claim 1, wherein:
the concavities comprise trenches; and
each of the trenches has a width of from 0.8 μm to 2 mm.

4. The sliding member of claim 1, wherein:
the concavities have a maximum depth of from 0.05 μm to 5.0 μm.

5. A sliding member comprising a sliding surface, the sliding surface comprising:
a base;
a filling part; and
an interlayer,
the base comprising a first material and having concavities regularly arranged in the sliding surface;
the filling part comprising a second material and arranged in the sliding surface to fill the concavities; and
the interlayer comprising a third material and lying between the base and the filling part,
wherein:
the first material comprises one material selected from the group consisting of metallic materials, ceramic materials, and carbonaceous materials;
the second material comprises at least one material selected from the group consisting of metallic materials, ceramic materials, and carbonaceous materials;
the third material comprises at least one material selected from the group consisting of metallic materials, ceramic materials, and carbonaceous materials;
the first and second materials differ from each other in at least one of frictional coefficient and hardness, wherein the second material has a lower frictional coefficient and a higher hardness than the first material;
the third material has high affinity with at least one of the first and second materials; and
the base, the filling part, and the interlayer are substantially flush with one another in the sliding surface.

6. A sliding member comprising a sliding surface, the sliding surface comprising:
a base;
a filling part; and
an interlayer,
the base comprising a first material and having concavities regularly arranged in the sliding surface;
the filling part comprising a second material and arranged in the sliding surface to fill the concavities; and
the interlayer comprising a third material and lying between the base and the filling part,
wherein:
the first material comprises one material selected from the group consisting of metallic materials, ceramic materials, and carbonaceous materials;
the second material comprises at least one material selected from the group consisting of metallic materials, ceramic materials, and carbonaceous materials;
the third material comprises at least one material selected from the group consisting of metallic materials, ceramic materials, and carbonaceous materials;
the first and second materials differ from each other in at least one of frictional coefficient and hardness, wherein the second material has a lower frictional coefficient and a higher hardness than the first material;
the third material differs from at least one of the first and second materials in at least one of frictional coefficient and hardness;
the base, the filling part, and the interlayer are substantially flush with one another in the sliding surface.

7. A sliding member comprising a sliding surface, the sliding surface comprising:
a base; and
a filling part,
the base comprising a first material and having concavities regularly arranged in the sliding surface; and
the filling part comprising a second material and arranged in the sliding surface to fill the concavities,
wherein:
the first material comprises one material selected from the group consisting of metallic materials, ceramic materials, and carbonaceous materials;
the second material comprises at least one material selected from the group consisting of metallic materials, ceramic materials, and carbonaceous materials;
the first and second materials differ from each other in at least one of frictional coefficient and hardness, wherein the second material has a lower frictional coefficient and a higher hardness than the first material; and
the base and the filling part are substantially flush with each other in the sliding surface, wherein
the concavities comprise holes; and
each of the holes has an opening area of from 0.5 $\mu m^2$ to 4 $mm^2$.

* * * * *